United States Patent
Sanji et al.

(10) Patent No.: US 11,343,951 B2
(45) Date of Patent: May 24, 2022

(54) SUBSTRATE PROCESSING MACHINE

(71) Applicant: FUJI CORPORATION, Chiryu (JP)

(72) Inventors: Mitsuru Sanji, Toyota (JP); Shingo Fujimura, Toyoake (JP)

(73) Assignee: FUJI CORPORATION, Chiryu (JP)

(*) Notice: Subject to any disclaimer, the term of this patent is extended or adjusted under 35 U.S.C. 154(b) by 256 days.

(21) Appl. No.: 16/496,705

(22) PCT Filed: Mar. 30, 2017

(86) PCT No.: PCT/JP2017/013181
§ 371 (c)(1),
(2) Date: Sep. 23, 2019

(87) PCT Pub. No.: WO2018/179200
PCT Pub. Date: Oct. 4, 2018

(65) Prior Publication Data
US 2020/0029480 A1 Jan. 23, 2020

(51) Int. Cl.
*B23P 19/00* (2006.01)
*H05K 13/08* (2006.01)
*H05K 13/04* (2006.01)

(52) U.S. Cl.
CPC ..... *H05K 13/0888* (2018.08); *H05K 13/0495* (2013.01); *H05K 13/0409* (2018.08)

(58) Field of Classification Search
CPC ........... H05K 13/0404; H05K 13/0409; H05K 13/0495; H05K 13/0888
See application file for complete search history.

(56) References Cited

U.S. PATENT DOCUMENTS

| 6,446,333 B1 | 9/2002 | Kashiwagi et al. |
| 10,879,100 B2* | 12/2020 | Hayashi .................. B65G 43/08 |
| 2018/0153062 A1* | 5/2018 | Sakurayama ...... H05K 13/0813 |

FOREIGN PATENT DOCUMENTS

| JP | 2000-277997 A | 10/2000 |
| JP | 2004-104075 A | 4/2004 |
| JP | 2009-111087 A | 5/2009 |
| JP | 2016-1668 A | 1/2016 |
| WO | WO 2012/105309 A1 | 8/2012 |

OTHER PUBLICATIONS

International Search Report dated Jun. 27, 2017 in PCT/JP2017/013181 filed Mar. 30, 2017.
Extended European Search Report dated Feb. 12, 2020 in European Patent Application No. 17902829.5, 9 pages.

* cited by examiner

*Primary Examiner* — Paul D Kim
(74) *Attorney, Agent, or Firm* — Oblon, McClelland, Maier & Neustadt, L.L.P.

(57) ABSTRACT

The object is to provide a substrate processing machine facilitating checking the operation of a device in the interior of a housing from the exterior of the housing. The substrate processing machine includes a base and a module, disposed on the base, and has a device configured to perform a predetermined operation contributing to the production of a substrate. The module can be switched between a fabrication position where the substrate is produced and an offset position that deviates from the production position relative to the base. The device can operate in the production position and the offset position. The operation speed of the device in the offset position is slower than the operation speed of the device to in the production position.

6 Claims, 4 Drawing Sheets

SUBSTRATE PROCESSING MACHINE

TECHNICAL FIELD

The present application relates to a substrate processing machine for performing predetermined work on a substrate.

BACKGROUND ART

Patent literature 1 discloses a production line in which multiple electronic component mounting machines are placed side by side. The multiple electronic component mounting machines are aligned side by side in a direction in which the production line extends. The electronic component mounting machine includes a housing and various types of devices (for example, an XY robot, a mounting head, suction nozzles, substrate conveyance devices, and the like). The various types of devices are housed in the interior of the housing.

PATENT LITERATURE

Patent Literature 1: JP-A-2009-111087

BRIEF SUMMARY

Technical Problem

In the above-described situation, there may be a case where an operator wants to check the operation of any one of the devices. For example, the operator may want to visually check the state of an electronic component held through suction to a suction nozzle as when an electronic component of a totally new type that has never been used on the production line is mounted on a substrate. However, the various types of devices are housed in the interior of the housing. In addition, the electronic component mounting machines, that is, the housings are arranged side by side in the extending direction of the production line. Due to this, the operations of the devices housed in the interior of the housing are difficult to check from the exterior of the housing. An object of the present disclosure is to provide a substrate processing machine that can facilitate checking the operation of a device in the interior of a housing from the exterior of the housing.

Solution to Problem

In order to solve the problem described above, there is provided a substrate processing machine including:
a base and
a module, disposed on the base, having a device configured to perform a predetermined operation contributing to fabrication of a substrate;
wherein the module is configured to be switched between a production position where the substrate is produced and an offset position that deviates from the production position relative to the base;
wherein the device is configured to operate in the production position and the offset position; and
wherein the operation speed of the device in the offset position is slower than the operation speed of the device in the production position.

Advantageous Effects

With the substrate processing machine of the present disclosure, the module can be switched between the production position and the offset position. In addition, with the substrate processing machine of the present disclosure, the device can be operated not only in the production position but also in the offset position.

DESCRIPTION OF EMBODIMENTS

Hereinafter, embodiments will be described in which a substrate processing machine of the present disclosure is embodied by an electronic component mounting machine.

Figure 1:
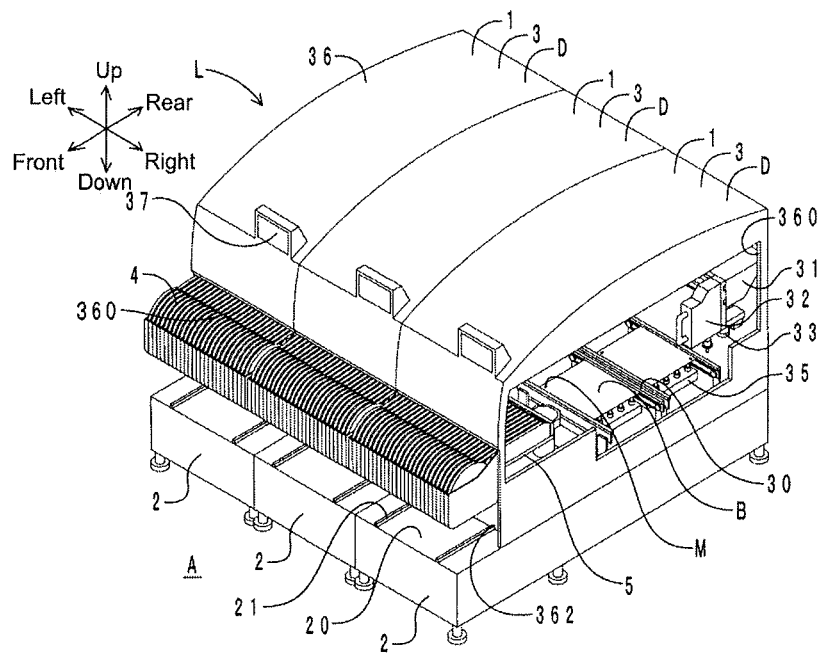
FIG. 1 is a perspective view of a production line in which multiple electronic component mounting machines constituting an embodiment of a substrate processing machine of the present disclosure are arranged side by side.
Figure 2:
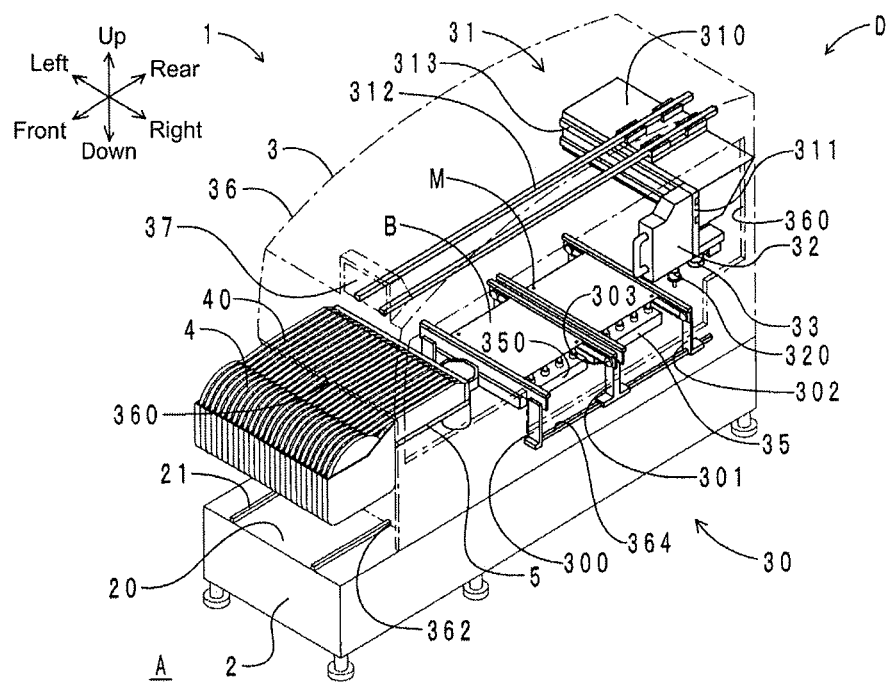
FIG. 2 is a perspective view of the same electronic component mounting machine.
Figure 3:
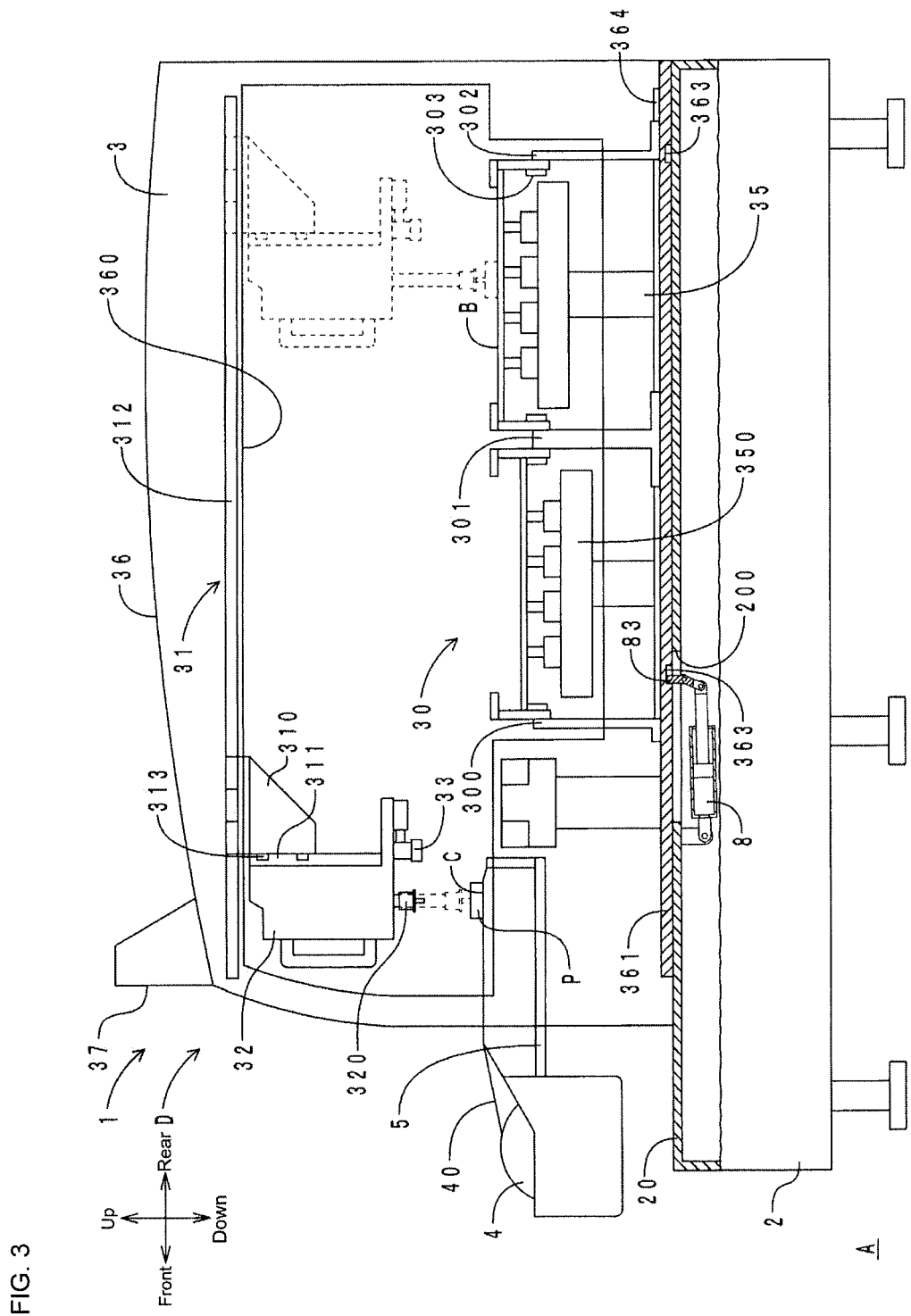
FIG. 3 is a right side view of the same electronic component mounting machine.
Figure 4:
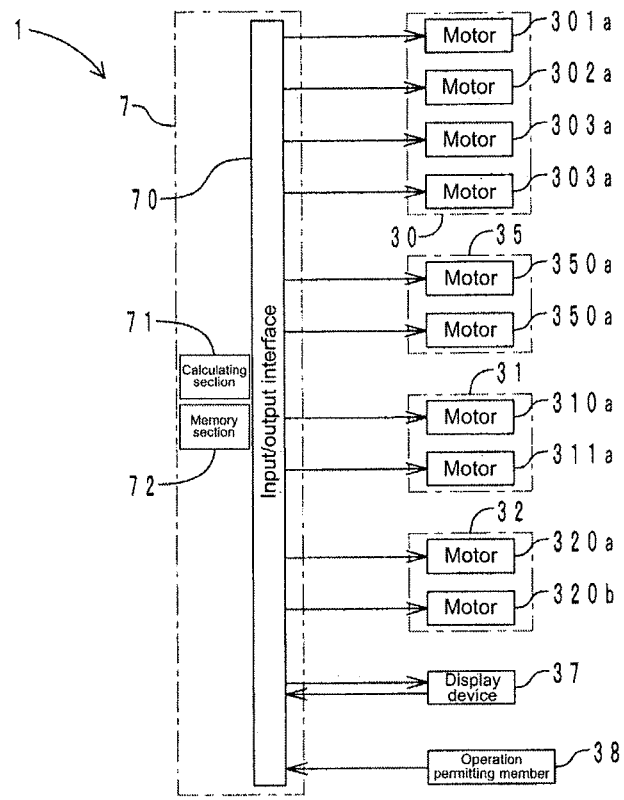
FIG. 4 is a block diagram of the same electronic component mounting machine.

Mechanical configuration of electronic component mounting machine First, the mechanical configuration of an electronic component mounting machine of the present embodiment will be described. FIG. 1 is a perspective view of a production line in which multiple electronic component mounting machines according to the present embodiment are arranged side by side. FIG. 2 is a perspective view of the electronic component mounting machine of the present embodiment. FIG. 3 is a right side view of the same electronic component mounting machine. FIG. 4 shows a block diagram of the same electronic component mounting machine. In FIGS. 2, 3, the interior of module 3 is shown as seen through housing 36. In FIG. 3, upper wall 20 of base 2 and bottom wall 361 of housing 36 are shown in cross section.

As shown in FIG. 1, multiple electronic component mounting machines 1 are arranged side by side in production line L. Multiple electronic component mounting machines 1 are aligned in a row in the left-right direction. Work area A for an operator is set at the front side of multiple electronic component mounting machines 1. As shown in FIGS. 2 to 4, electronic component mounting machine 1 includes base 2, module 3, multiple tape feeders (component supply devices) 4, device pallet 5, control device 7, and clamping device 8. Clamping device 8 is included in the concept of a "fixing section" of the present disclosure.

Base 2 is disposed on the floor (not shown) of a factory. Opening section 200 is opened in upper wall 20 of base 2. A pair of left and right guide rails (base side guide sections) 21 is disposed on the upper surface of upper wall 20. Guide rails 21 extend in the front-rear direction.

Module 3 is disposed detachably on upper wall 20 of base 2. Module 3 includes substrate conveyance device 30, XY robot 31, mounting head 32, mark camera (imaging device) 33, substrate lifting and lowering device 35, housing 36, display device 37, and operation permission member 38. Substrate conveyance device 30, XY robot 31, mounting head 32, mark camera 33, and substrate lifting and lowering device 35 are included in the concept of a "device" of the present disclosure. Operation permission member 38 is included in the concept of an "operation permission section" of the present disclosure.

Housing 36 constitutes an outer shell of module 3. Substrate conveyance device 30, XY robot 31, mounting head 32, mark camera 33, and substrate lifting and lowering device 35 are housed in the interior of housing 36. Opening section 360 is formed in the front face of the front wall (a wall on the side facing work area A), the left face of the left wall (a wall on the upstream side of production line L), and the right face of the right wall (a wall on the downstream side of production line L) of housing 36. The left face of the left wall and the right face of the right wall are included in the concept of an "end surface (of the module) facing the direction in which (the modules) are arranged side by side" in the present disclosure. A pair of left and right groove sections (module side guide sections) 362 are provided on the lower surface of bottom wall 361 of housing 36 by recessing the lower surface. Groove sections 362 extend in the front-rear direction. Guide rails 21 are brought into sliding contact with corresponding groove sections 362. Due to this, module 3 can slide in the front-rear direction relative to base 2. A pair of front and rear recessed sections 363 are provided on the lower surface of bottom wall 361 by recessing the lower surface. A pair of left and right guide rails 364 are disposed on the upper surface of bottom wall 361. Guide rails 364 extend in the front-rear direction.

Substrate conveyance device 30 includes fixed wall 300, first movable wall 301, and second movable wall 302 arranged in that order from the front side to the rear side. First movable wall 301 and second movable wall 302 can move in the front-rear direction along the pair of left and right guide rails 364 using motors (actuators) 301a, 302a, shown in FIG. 4, respectively. That is, the conveyance width of substrate B can be changed.

Belt conveyor (substrate conveyance section) 303 is disposed on the rear face (inner face) of fixed wall 300 and the front face (inner face) of first movable wall 301. Belt conveyor 303 extends in the left-right direction. Similarly, belt conveyor 303 is disposed on the rear face (inner face) of first movable wall 301 and the front face (inner face) of second movable wall 302. Each of the pair of belt conveyors 303 is driven by motor 303a shown in FIG. 4.

Substrate lifting and lowering device 35 includes a pair of front and rear lifting and lowering sections 350. Each of the pair of lifting and lowering sections 350 can move in an up-down direction using motor 350a shown in FIG. 4. Lifting and lowering section 350 is disposed below belt conveyors 303. The position of substrate B can be switched between a mounting preparation position (a position of front substrate B shown in FIG. 3) at a substrate conveyance height and a mounting position (a position of rear substrate B shown in FIG. 3) lying higher than the substrate conveyance height by lifting and lowering section 350.

XY robot 31 includes Y-direction slider 310, X-direction slider 311, a pair of left and right Y-direction guide rails 312, and a pair of up and down X-direction guide rails 313. The pair of left and right Y-direction guide rails 312 is disposed on the lower surface of the upper wall of housing 36. Y-direction slider 310 is attached to the pair of left and right Y-direction guide rails 312 in such a manner as to slide in the front-rear direction. The pair of up and down X-direction guide rails 313 is disposed on the front face of Y-direction slider 310. X-direction slider 311 is attached to the pair of up and down X-direction guide rails 313 in such a manner as to slide in the left-right direction.

Mounting head 32 is attached to X-direction slider 311. Due to this, mounting head 32 can be moved in the front-rear direction and the left-right direction by XY robot 31. Suction nozzle 320 is attached to the lower side of mounting head 32 in such a manner as to be exchangeable. Suction nozzle 320 can move relative to mounting head 32 downwards and in the rotational direction (the rotational direction around the axis of the vertical shaft). Due to this, suction nozzle 320 can move in the front-rear direction, the left-right direction, the up-down direction, and the rotational direction. Y-direction slider 310 is driven by motor 310a shown in FIG. 4, X-direction slider 311 is driven by motor 311a shown in FIG. 4, and suction nozzle 320 is driven by lifting and lowering motor 320a and rotation motor 320b shown in FIG. 4.

Mark camera 33 is attached to X-direction slider 311 together with mounting head 32. Mark camera 33 is disposed on the rear side of suction nozzle 320. Mark camera 33 can be moved in the front-rear direction and left-right direction together with mounting head 32 by XY robot 31. Mark camera 33 can image positioning reference mark M on the upper surface of substrate B.

Device pallet 5 is mounted in opening section 360 in the front wall of housing 36. Multiple tape feeders 4 are each mounted detachably on device pallet 5. Multiple electronic components P are installed on tape 40 of tape feeder 4 along the longitudinal direction thereof. Component pickup position C is set at the rear end portion on the upper surface of tape feeder 4. Component pickup position C is housed in the interior of housing 36. Suction nozzle 320 picks up electronic component P from component pickup position C and mounts electronic component P on a predetermined mounting coordinate on substrate B.

Figure 5:
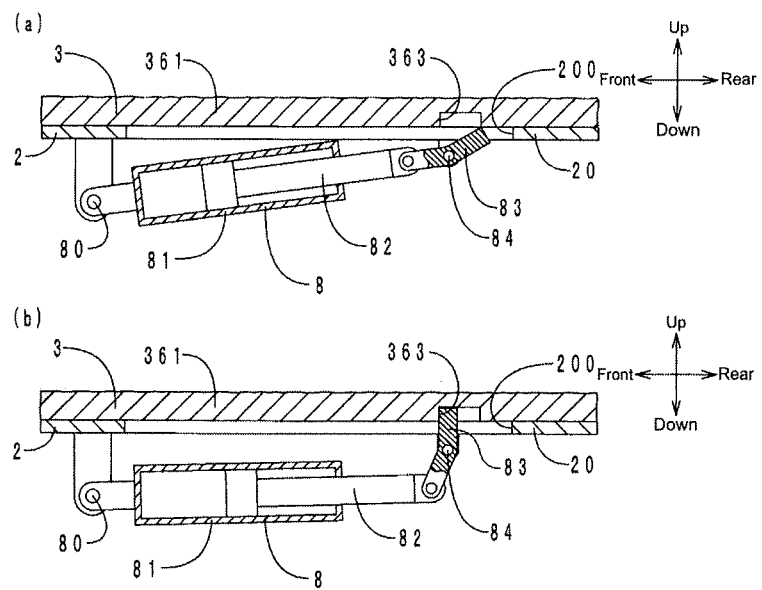
FIG. 5(a) is a longitudinal sectional view taken along the front-rear direction of a clamping device of the same electronic component mounting machine in a released state.
FIG. 5(b) is a longitudinal sectional view taken along the front-rear direction of the clamping device of the same electronic component mounting machine in a locked state.

As shown in FIG. 3, clamping device 8 is disposed near opening section 200 in the interior of base 2. FIG. 5(a) shows a longitudinal sectional view taken along the front-rear direction of the clamping device of the electronic component mounting machine in a released state according to the present embodiment. FIG. 5B is a longitudinal sectional view taken along the front-rear direction of the same clamping device in a locked state. As shown in FIGS. 5(a) and 5(b), clamping device 8 includes cylinder rocking shaft 80, cylinder 81, piston 82, pin 83, and pin rocking shaft 84.

Cylinder rocking shaft 80 is disposed on the lower surface of upper wall 20. The front end of cylinder 81 is attached to cylinder rocking shaft 80 in such a manner as to rock. Piston 82 can extend and contract from the rear end of cylinder 81 towards the rear side. Pin rocking shaft 84 is disposed on the lower surface of upper wall 20. The central portion of pin 83 is attached to pin rocking shaft 84 in such a manner as to rock. In addition, the front end of pin 83 is attached to the rear end (projecting end) of piston 82 in such a manner as to rock.

As shown in FIG. 5(a), in the released state, the rear end (the free end) of pin 83 is retracted in the interior of opening section 200 of upper wall 20 of base 2. Pin 83 is not engaged with recessed section 363 on bottom wall 361 of module 3. Due to this, module 3 can slide in the front-rear direction relative to base 2. When pin 83 is switched from the released state shown in FIG. 5(a) to the locked state shown in FIG.

5(b), piston 82 is caused to project to the rear side from cylinder 81. Pin 83 is then caused to rock in a counterclockwise direction in the figure around pin rocking shaft 84. That is, pin 83 is caused to project upwards from opening section 200. As shown in FIG. 5(b), in the locked state, pin 83 is engaged with recessed section 363 on bottom wall 361 of module 3. By this, module 3 is fixed to base 2.

In this way, when clamping device 8 is in the released state shown in FIG. 5(a), module 3 can be slid in the front-rear direction relative to base 2. On the other hand, when clamping device 8 is in the locked state shown in FIG. 5(b), module 3 can be fixed to base 2.

Electrical configuration of electronic component mounting machine Next, an electrical configuration of the electronic component mounting machine of the present embodiment will be described. As shown in FIG. 4, control device 7 includes input/output interface 70, calculating section 71, and memory section 72. Input/output interface 70 is connected individually to motors 301a, 302a, 303a, 350a, 310a, 311a, 320a, 320b by way of a drive circuit (not shown).

Additionally, input/output interface 70 is connected to display device (touch panel) 37. Display device 37 is disposed on the front face of housing 36. Control device 7 can cause display device 37 to display a state of electronic component mounting machine 1 thereon. In addition, the operator can input a predetermined command into electronic component mounting machine 1 via display device 37.

Input/output interface 70 is detachably connected to operation permission member 38. Control device 7 can drive substrate conveyance device 30, XY robot 31, mounting head 32, mark camera 33, and substrate lifting and lowering device 35 only while the operator is gripping operation permission member 38 in an offset position, which will be described later.

Movement of Electronic Component Mounting Machines)

Next, the movement of the electronic component mounting machines of the present embodiment will be described. Electronic component mounting machine 1 can be switched between a production mode and an operation checking mode. As shown in FIGS. 1 to 3, in the production mode, all modules 3 are disposed in production positions D. As shown in FIGS. 3, 5(b), in production position D, clamping device 8 is switched to the locked state. Specifically, as shown in FIG. 3, the pair of front and rear recessed sections 363 are disposed on bottom wall 361 of module 3. Pin 83 of clamping device 8 is engaged with front recessed section 363. By this, module 3 is fixed to base 2.

In the production mode, multiple electronic component mounting machines 1 arranged on production line L each mount electronic components P allocated thereto at predetermined mounting coordinates of substrates B. As an example, describing second leftmost electronic component mounting machine 1 shown in FIG. 1, control device 7 shown in FIG. 4 first drives substrate conveyance device 30 and conveys in substrate B from separate electronic component mounting machine 1 on the left side (the upstream side) to the mounting preparation position (the position of front substrate B in FIG. 3) via opening section 360 in the left wall. Next, control device 7 drives substrate lifting and lowering device 35 and lifts up substrate B to the mounting position (the position of rear substrate B in FIG. 3). Subsequently, control device 7 drives XY robot 31 and mounting head 32 and conveys electronic component P from component pickup position C to a predetermined mounting coordinate on substrate B. When electronic components P allocated to electronic component mounting machine 1 in question are mounted completely, control device 7 drives substrate lifting and lowering device 35 and lowers substrate B from the mounting position to the mounting preparation position. Thereafter, control device 7 drives substrate conveyance device 30 and conveys out substrate B in question from the mounting preparation position to separate electronic component mounting machine 1 on the right side (the downstream side) via opening section 360 in the right wall.

Figure 6:
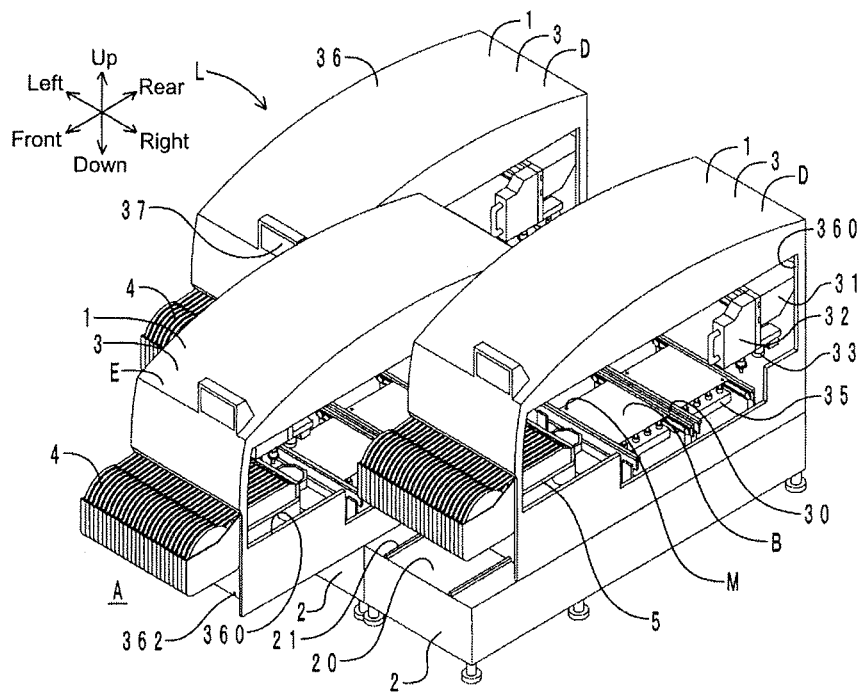
FIG. 6 is a perspective view of a production line including an electronic component mounting machine having an operation checking mode.

FIG. 6 shows a perspective view of a production line including an electronic component mounting machine in the operation checking mode. In the present embodiment, electronic component mounting machine 1 which is subjected to the operation checking mode is second leftmost electronic component mounting machine 1. When electronic component mounting machine 1 in question is switched from the production mode to the operation checking mode, the operator first touches a mode switching button on a screen of display device 37. Next, control device 7 switches clamping device 8 from the locked state shown in FIG. 5(b) to the released state shown in FIG. 5(a). Subsequently, the operator, from work area A, pulls out module 3 to the front side relative to base 2 along guide rails 21. Then, rear recessed section 363, which is shown in FIG. 3, is disposed directly above pin 83 of clamping device 8. Then, control device 7 switches clamping device 8 from the released state shown in FIG. 5(a) to the locked state shown in FIG. 5(b). That is, module 3 is fixed to base 2. In this manner, switching work from the production mode to the operation checking mode is performed. Interlocking with the operation checking mode may be released by putting clamping device 8 in the locked state shown in FIG. 5(b). A similar configuration to this can also be provided in the production mode.

In the operation checking mode, module 3 is disposed in offset position E. Offset position E is set in front of (towards work area A) of production position D. Module 3 in offset position E projects forwards relative to module 3 in production position D. This allows the operator to visually check the device (substrate conveyance device 30, XY robot 31, mounting head 32, mark camera 33, substrate lifting and lowering device 35) in the interior of housing 36 via opening sections 360 in the left wall and right wall of module 3 from work area A.

In the operation checking mode, multiple operation buttons are displayed on the screen of display device 37. The multiple operation buttons correspond individually to the multiple devices in the interior of housing 36. In the operation checking mode, the operator first connects operation permission member 38 shown in FIG. 4 to control device 7 by way of a connector (not shown) of module 3. Next, the operator selects an operation button corresponding to the device that the operator wants to check the operation thereof from the multiple operation buttons of display device 37. For example, when the operator wants to check a pickup operation of picking up electronic component P from component pickup position C shown in FIG. 3, the operator touches an operation button corresponding to mounting head 32. Subsequently, the operator grasps a grip (not shown) of operation permission member 38. While the operator is grasping the grip of operation permission member 38, control device 7 performs an operation of moving mounting head 32 to pick up electronic component P from component pickup position C. Here, the operation speed of mounting head 32 in the operation checking mode is slower than the operation speed of mounting head 32 in the production mode. For example, assuming that the operation speed in the production mode is referred to 100%, the operation speed in the operation checking mode is 10% or smaller (for example, 1% or greater and 5% smaller, more desirably, 2% or greater and 3% or smaller) of the operation speed in the production mode. Due to this, the operator is allowed to visually check the operation of mounting head 32 through opening sections 360 in the left wall and right wall of module 3 from work area A.

Control device 7 stops mounting head 32 after a predetermined operation is completed. Even during the predetermined operation, when the operator moves his or her hand from the grip of operation permission member 38, control device 7 forcibly stops mounting head 32. In addition, even when the predetermined operation is underway and the operator continues to grasp the grip of operation permission member 38, in the event that a predetermined error (for example, an excessive load on any one of multiple motors 310a, 311a, 320a, 320b that are used for the operation of mounting head 32) occurs, control device 7 immediately stops mounting head 32. In this manner, control device 7 executes the operation checking mode. Here, the operation checking mode is described as being performed using a grip; however, the operation checking mode can even be performed by keeping the operation button depressed. Note that, in the operation checking mode, electronic component P can also be prevented from being conveyed as far as the predetermined mounting coordinate on substrate B. In this case, it is not necessary to generate negative pressure or to perform a clamping operation to convey electronic component P.

After the operation checking mode is completed, the electronic component mounting machine 1 in question may be returned to the production mode. In addition, a setup change for changing the types of substrate B to be produced or replacement work of replacing modules 3 (in this case, module 3 is further pulled out from the offset position to the front side to remove module 3 from base 2. Then, separate module 3 is attached to base 2.) may be performed.

Effects

Next, the effects of the electronic component mounting machine of the present embodiment will be described. As shown in FIG. 6, with electronic component mounting machine 1 of the present embodiment, module 3 can be switched between production position D and offset position E. Offset position E deviates forwards relative to production position D. Due to this, in the case where multiple electronic component mounting machines 1 are aligned side by side in the left-right direction, module 3 in offset position E projects forward relative to module 3 in production position D. Therefore, the device (substrate conveyance device 30, XY robot 31, mounting head 32, mark camera 33, substrate lifting and lowering device 35, and the like) in the interior of housing 36 can easily be checked from the exterior of housing 36.

In addition, with electronic component mounting machine 1 of the present embodiment, a device in the interior of housing 36 can be operated not only in production position D but also in offset position E. The operation speed of the device in the interior of housing 36 when electronic component mounting machine 1 is in the offset position is slower than the operation speed of the device in the interior of housing 36 when in the production position. Due to this, the operation of the device in the interior of housing 36 can easily be checked from the exterior of housing 36.

Additionally, opening section 360 is opened in the left wall and the right wall of housing 36. Due to this, as shown in FIG. 6, the device in the interior of housing 36 can be checked through opening section 360 from the exterior of housing 36 in offset position E. Opening sections 360 are always opened in the left wall and the right wall of housing 36 to enable substrate B to be transferred between adjacent electronic component mounting machines 1. With electronic component mounting machine 1 of the present embodiment, the device in the interior of housing 36 can be checked from the exterior of housing 36 by making use of opening sections 360.

As shown in FIG. 4, electronic component mounting machine 1 includes detachable operation permission member 38. In the offset position, control device 7 permits the device in the interior of housing 36 to operate only while the operator is grasping the grip of operation permission member 38. Due to this, the operation of the device in the interior of housing 36 can forcibly be stopped by the operator moving his or her hand away from the grip of operation permission member 38. In addition, control device 7 can immediately stop the operation of the device in the interior of housing 36 in the event that a predetermined error occurs even though the operator continues to grasp the grip of operation permission member 38.

As shown in FIGS. 5(a), 5(b), electronic component mounting machine 1 includes clamping device 8. Due to this, module 3 can be fixed to base 2 not only in production D but also in offset position E. Therefore, the positional relationship between base 2 and module 3 in offset position E can be maintained.

As shown in FIG. 6, work area A for the operator is set in front of base 2. That is, offset position E is disposed closer to (or within) work area A than production position D. Due to this, the operation of the device in the interior of housing 36 can easily be checked.

Other

Thus, an embodiment of the substrate processing machine of the present disclosure has been described above. However, embodiments are not particularly limited to the mode described above. The present disclosure can also be carried out in various modified modes or improved modes.

Figure 7:
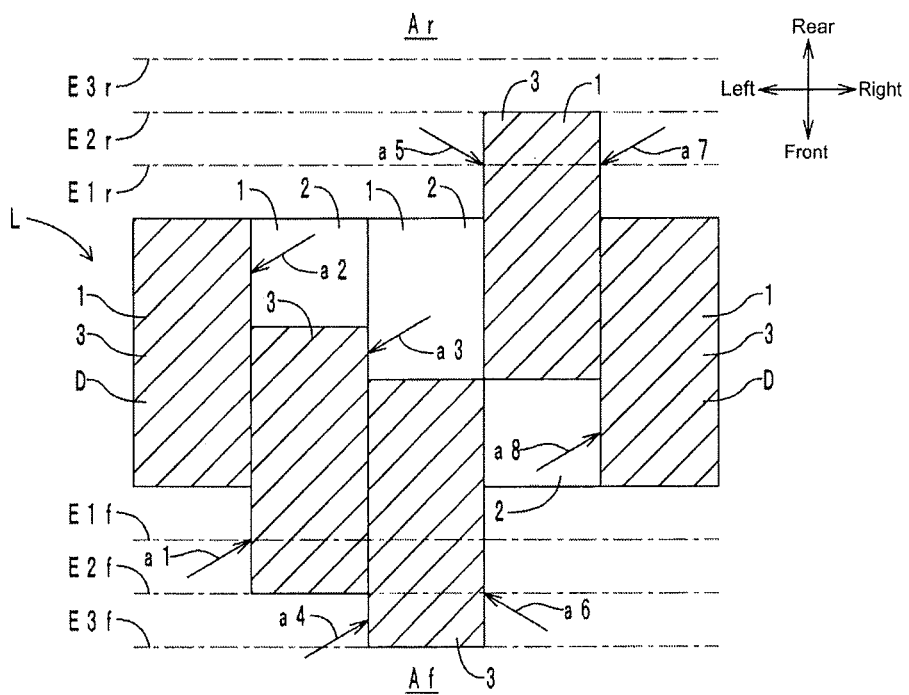
FIG. 7 is a top view of a production line according to another embodiment in which multiple electronic component mounting machines are arranged side by side.

FIG. 7 shows a top view of a production line in which electronic component mounting machines of another embodiment are arranged side by side. Like reference signs are given to portions corresponding to those shown in FIG. 6. As shown in FIG. 7, a pair of front and rear work areas Af, Ar are set on both sides in the front-rear direction of production line L. Also, three stage offset positions E1f to Ef3 and E1r to E1r are set individually on both the sides in the front-rear direction in production position D. In electronic component mounting machine 1, module 3 can be caused to deviate in three stages to the front side and in three stages to the rear side relative to production position (base 2). As indicated by arrows a1 to a8 in FIG. 7, for any pair of laterally adjacent modules 3 whose front-rear directions deviate relative to each other, the operator can check devices in the interiors of the housings of both modules 3. In particular, for any pair of laterally adjacent modules 3, when one module is disposed in one of front offset positions E1f to Ef3, while the other is set in one of rear offset positions E1r to E3r, the opened areas of opening sections of both modules 3 become large. This makes it easier for the operator to check the devices in the interiors of the housings of both modules 3.

Additionally, offset positions E1f to E3f and E1r to E3r and devices that can operate in offset positions E1f to E3f and E1r to E3r may be associated with each other. For example, the XY robot, the mounting head, and the mark camera may be referred to as devices that can operate in offset positions E1f, E1r. Additionally, in addition to the XY robot, the mounting head, and the mark camera, the substrate conveyance device and the substrate lifting and lowering device may be referred to as devices that can operate in offset positions E3f, E3r.

No particular limitation is imposed on the types of devices in the interior of housing 36 that constitute operation checking targets in the operation checking mode. For example, such checking target devices may include the robot, the mounting head, an electronic component clamp (a lead clamp, a body clamp), the substrate conveyance device, the substrate lifting and lowering device, an illumination device, the imaging device, a cut-and-clinch device (a device that cuts and bends an excess portion of a lead of an electronic component), a squeegee, a screen mask, and the like that move in a predetermined direction (at least one of X-direction (left-right direction), Y-direction (front-back direction), Z-direction (up-and-down direction), θx direction (direction that rotates around the X-axis), θ direction (direction that rotates around the Y-axis), and θz direction (direction that rotates around the Z-axis)). In addition, in a single operation checking mode, operations of the multiple devices (for example, an associated operation of the multiple devices) may be checked.

Devices in the interior of housing 36 may be imaged by an imaging device (a camera) from the exterior of housing 36 through opening section 360 on the left side or the right side of housing 36 in offset position E shown in FIG. 6. Alternatively, an image or a moving image may be recorded.

In order to detect an object intruding into opening section 360 on the left side or the right side of housing 36 in offset position E shown in FIG. 6, a sensor (for example, a light blocking sensor, a camera, or the like) may be disposed in electronic component mounting machine 1. When the sensor detects an intruding object, control device 7 shown in FIG. 4 may immediately stop the operation of the device. No specific limitation is imposed on the size, shape, and the number disposed of opening section 360 shown in FIG. 6. A mirror may be disposed in the interior of housing 36 to enable recognition of the device in the interior of housing 36 through opening section 360 from the exterior of housing 36. The operation of a desired device may then be checked via the mirror.

As the operation permission section, a key may be disposed in electronic component mounting machine 1. In this case, control device 7 shown in FIG. 4 activates the device in the interior of housing 36 in offset position E only when the key is turned on.

A tray feeder, a stick feeder, a bulk feeder, or the like may be disposed as the component supply device. No specific limitation is imposed on the type of the substrate processing machine. The substrate processing machine need only include base 2 and module 3. For example, the substrate processing machine may be a screen printer, a substrate appearance inspection device, a reflow oven, or the like. No specific limitation is imposed on the number of substrate processing machines arranged (aligned side by side) on production line L. In addition, the direction in which production line L extends does not have to intersect the direction in which module 3 is switched between production position D and offset position E at right angles. For example, the extending direction of production line L may coincide with the switching direction of module 3 between production position D and offset position E.

REFERENCE SIGNS LIST

1: electronic component mounting machine (substrate processing machine), 2: base, 3: module, 4: tape feeder, 5: device pallet, 7: control device, 8: clamping device (fixing section), 20: upper wall, 21: guide rail, 30: substrate conveyance device (device), 31: XY robot (device), 32: mounting head (device), 33: mark camera (device), 35: substrate lifting and lowering device (device), 36: housing, 37: display device, 38: operation permitting member (operation permitting section), 40: tape, 70: input/output interface, 71: calculating section, 72: memory section, 80: cylinder rocking shaft, 81: cylinder, 82: piston, 83: pin, 84: pin rocking shaft, 200: opening section, 300: fixed wall, 301: first movable wall, 301a: motor, 302: second movable wall, 302a: motor, 303: belt conveyor, 303a: motor, 310: Y-direction slider, 310a: motor, 311: X-direction slider, 311a: motor, 312: Y-direction guide rail, 313: X-direction guide rail, 320: suction nozzle, 320a: motor, 320b: motor, 350: lifting and lowering device, 350a: motor, 360: opening section, 361: bottom wall, 362: groove section, 363: recessed section, 364: guide rail, A: work area, Af: work area, Ar: work area, B: substrate, C: component pickup position, D: production position, E: offset position, E1f to E3f: offset position, E1r to E3r: offset position, L: production line, M: reference mark, P: electronic component

The invention claimed is:

1. A substrate processing machine, comprising:
   a base;
   a module, disposed on the base, having a device configured to perform a predetermined operation contributing to the production of a substrate; and
   a control device configured to control the predetermined operation of the device;
   wherein the module is switched switchable between a first production position where the substrate is produced and a second offset position that deviates from the first production position relative to the base;
   wherein the device operates in the first production position and the second offset position;
   wherein the control device is configured to determine whether the module is in the first production position or the second offset position; and
   wherein, when the module is in the first production position, the control device is configured to control the device such that an operation speed of the device is a first speed, and when the module is in the second offset position, the control device is configured to control the device such that the operation speed of the device is at a second speed, the second speed being slower than the first speed.

2. The substrate processing machine according to claim 1, wherein the module has a housing configured to accommodate the device and provided with an opening portion open at an end surface of the module facing a first direction, and
   wherein, in the second offset position, the device can be recognized through the opening portion from an exterior of the housing.

3. The substrate processing machine according to claim 2, wherein a work area for an operator can be set in a second direction that intersects the first direction.

4. The substrate processing machine according to claim 1, further comprising:
   an operation permission section configured to permit the device to operate in the second offset position.

5. The substrate processing machine according to claim 1, further comprising:
   a fixing section configured to fix the module to the base in the second offset position.

6. The substrate processing machine according to claim 1, wherein the device is a substrate conveyance device, an XY robot, a mounting head, a mark camera, or a substrate lifting and lowering device.

* * * * *